United States Patent [19]

Andresen et al.

[11] Patent Number: 4,496,914
[45] Date of Patent: Jan. 29, 1985

[54] PIEZO HARN SELF-OSCILLATING DRIVE CIRCUIT

[75] Inventors: Bernhard H. Andresen, Dallas; Stephen R. Schenck, McKinney; Nathan R. Kennedy, Sunnyvale, all of Tex.

[73] Assignee: Texas Instruments Incorporated

[21] Appl. No.: 321,281

[22] Filed: Nov. 13, 1981

[51] Int. Cl.³ ............................................. H03B 5/36
[52] U.S. Cl. ............................... 331/110; 331/113 R; 331/116 R
[58] Field of Search .......... 331/108 D, 113 R, 116 R, 331/158, 116 FE, 110, 138, 139, 113 S; 310/316, 317; 340/384 E

[56] References Cited

U.S. PATENT DOCUMENTS 3,341,841 9/1967 Stampfli .......................... 340/384 E
3,638,223 1/1972 Potter .............................. 331/110 X
3,657,634 4/1972 Eastop ........................ 331/113 S X
3,763,488 10/1973 Klasing .......................... 340/384 E

FOREIGN PATENT DOCUMENTS 0038648 6/1968 Japan .............................. 331/113 S Primary Examiner—Siegfried H. Grimm
Attorney, Agent, or Firm—Richard A. Bachand; N. Rhys Merrett; Melvin Sharp

[57] ABSTRACT

A circuit is disclosed for driving a piezo ceramic device as used in smoke alarms or other audio warning devices. The circuit detects the resonant frequency of the piezo horn and provides an alternating current at the resonant frequency of the horn for maximum sound output. The circuit has a self starting resonant oscillation characteristic. Two pairs of switches act in concert to alternatingly connect each side of the piezo horn to the supply voltage and ground, causing the maximum voltage swing across the piezo horn to be effectively twice the available power supply voltage.

1 Claim, 1 Drawing Figure

PIEZO HARN SELF-OSCILLATING DRIVE CIRCUIT

BACKGROUND OF THE INVENTION

The use of piezo ceramic acoustic horns in warning devices has been suggested to simplify manufacture and improve reliability. A smoke detector for example, may require an 85 decibel output from a 9.1 volt power supply. In order to achieve this output level, it is necessary to operate the piezo horn at its resonant frequency.

Various methods have been tried in order to drive a piezo horn at its resonant frequency to maximize sound output. Accuracy is required, however, since the anti-resonant frequency of the horn is normally within 300 to 500 hertz of the resonant frequency, and thus requires precision in adjustment of the tuning circuit to the horn.

Various methods have been suggested utilizing a feedback terminal which has a peak output when oscillating on the resonant frequency. This circuit has two major problem areas for use in a battery operated device, for example. This system in operation tends to be power consumptive and therefore impractical for battery operation. Another problem is that the supply voltage is generally insufficient to get an 85 decibel sound output required for example, in a smoke detector, from the piezo horn.

The voltage may be doubled by alternatively switching the positive side of the voltage supply and the ground connection between the two terminals of the piezo horn and thus the total voltage swing of each side of the horn will be twice the total voltage supply value. This method effectively increases the power to the piezo horn, however, this method still requires the feedback detector and circuitry required to sense the proper switching and the circuitry required to initiate the resonant oscillation. Furthermore, it is difficult to get the feedback voltage signal to operate precisely in phase with the actual resonant signal.

Accordingly, it is an object of the present invention to provide a piezo horn driver circuit which is self-starting without requiring external components.

It is a further object of the present invention to provide a piezo driver circuit that runs on resonant frequency without requiring a separate feedback signal.

A yet further object is to provide a piezo horn driver circuit having maximum voltage swing applied to the horn in a bidirectional oscillation.

A still further object is to provide a piezo horn driver circuit capable of interfacing with logic signals at low current levels.

SUMMARY AND BRIEF DESCRIPTION OF THE DRAWING

A piezoelectric oscillator system comprises a piezoelectric device having a resonant frequency, means for initiating oscillation electrically connected to the device, means for sensing the resonant frequency, means for switching oscillating drive power to the device in response to the sensed resonant frequency thereby driving the device at substantially resonant frequency; wherein the means for switching and the means for sensing are integrated on the same substrate, and signal means operatively connected to the system providing on and off signals to the piezoelectric oscillator.

An integrated circuit in accordance with the present invention is operable to drive a piezoelectric device having a resonant frequency, and comprises means for initiating oscillation, means for sensing the resonant frequency, and means for switching the circuit to maintain oscillation substantially at the resonant frequency.

A method of driving a piezoelectric device in accordance with the present invention comprises the steps of initiating and driving an oscillation electrically in the device, sensing the drive current of the device, and switching the drive voltage across opposing terminals of the device when the sensed drive current is essentially zero.

Furthermore, the initiating and driving, the sensing, and the switching steps are performed concurrently by circuitry integrated on a single substrate.

The drawing is a schematic circuit diagram of a piezoelectric driver circuit in accordance with the present invention.

DETAILED DESCRIPTION OF THE DRAWING

Figure 1:
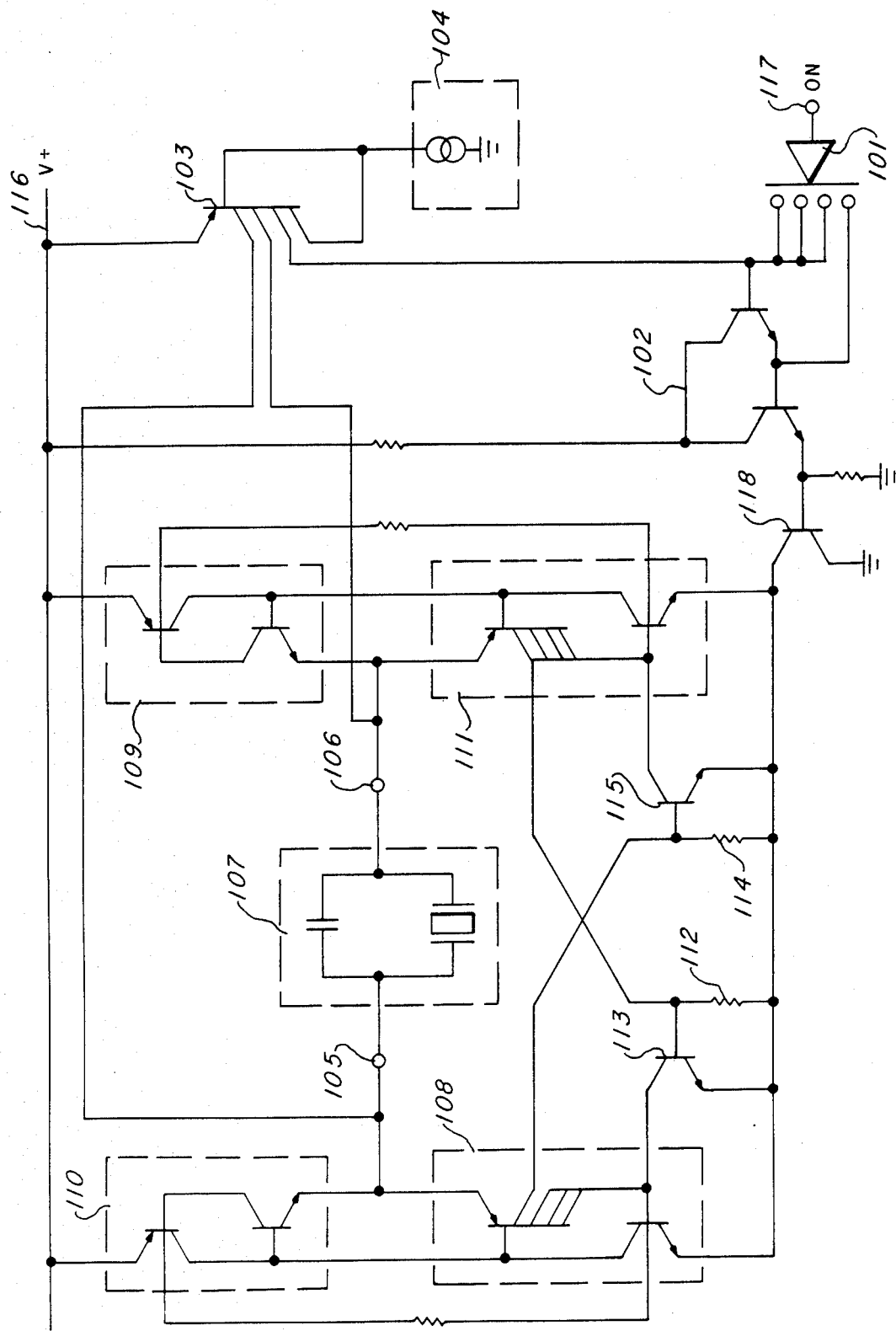

Referring now to the drawing, a schematic circuit representation of one embodiment of the present invention is shown as it is built upon an integrated circuit. A logic input signal is received at input terminal 117 into an integrated injection logic gate 101 operating as an on/off switch for the horn driver circuit.

A current source 104 is shown connected to the multiple collector transistor 103 wherein the current source 104 provides a constant current source of approximately 50 nanoamperes and is provided by an I$^2$L gate having a collector region tied to the base region, in one embodiment.

Line 116 provides the power supply voltage to the circuit and is connected to other circuitry which is built upon the same substrate.

Bond pads 105 and 106 are connected to the external components shown within the box 107, such as the piezohorn and a capacitor connected in parallel with the horn. All the remaining circuit elements are integrated on an integrated circuit as shown in the drawing. In actual operation, a logic signal inputted at terminal 117 provides an ON signal at the darlington coupled pair shown at 102 to turn on the ground transistor 118 for the remainder of the circuitry which, when on, allows this circuit to oscillate, and when off provides a positive shutoff to the oscillation and therefore dampens the horn. The circuit as designed is inherently unstable and thus when a current is provided by transistor 103 at the connection points adjacent bond pads 105 and 106 a charge imbalance, either present at turnoff, which remains when the circuit is turned on, or induced by the current flowing from Vcc, 116, through transistor 103, will provide sufficient current in the circuit to initiate oscillation.

The current flowing through SCR 109 will flow to the bond pad 106 and from there to the piezo horn and capacitor in parallel until sufficient charge is built up to prevent further current flow. During this initial build up, a current is flowing from bond pad 105 through SCR 108, a portion of which is diverted through one of the collector connections into resistor 114 and transistor 115, which while on maintains SCR 111 in the off state. When the current proceeding from bond pad 106 to bond pad 105 through the piezo horn reaches zero, the transistor 115 turns off, allowing the SCR 111 to turn on and thus turning off through the operation of transistor 113 SCR 108, and SCR 109, rapidly in succession. When 115 turns off as a direct result of the current through the piezo horn reaching substantially zero current flow, the opposing SCR, not in conduction, turns on, in this case 111, allowing SCR 110 to turn on and rapidly thereafter shutting off SCR 108 and SCR 109. This is the opposing phase of the oscillation cycle, and as current from bond pad 105 to 106 through the piezo horn in the opposite direction from the first state of conduction approaches zero, a similar effect occurs thus turning on SCR 108 which again rapidly, in succession, turns off SCR 111 and SCR 110 and turns on SCR 109. This process is repeated and is controlled by the resonant frequency of the piezo horn, in that as it attempts to slow down current flow at its resonant frequency, this is reinforced by the rapid turning off and on of the SCR's in the driver circuit.

In actual operation, various piezo ceramic horns were connected to the circuit. Resonant frequencies from 3K Hz to 40K Hz were tested and the circuit operated well in every case. No problems were encountered with initiating oscillation, or with circuit shutoff. The circuit operates at the resonant frequency of the attached piezo horn, and requires no tuning or R-C circuit with external components. Furthermore, the circuit will stay at the resonant frequency of the piezo horn even as the resonant frequency shifts due to aging or temperature fluctuations of the horn.

The driver circuit will maintain whichever state of current flow exists as long as enough current flows through the external capacitor and the piezo horn, to supply drive to either transistor 115 or transistor 113, dependant upon which state of the cycle the current flow is in. The external capacitor is required in the system to prevent oscillation at harmonic frequencies.

The resultant drive wave is a square wave drive form which further enhances the power output of the piezo device. Experimental results of the square wave drive have shown an increase of three decibels in output power resulting from the square wave drive current format as compared to a sinusoidal drive current.

The actual current at the switching point from a design point of view will be four times the voltage from base to emitter (Vbe) of transistor 113 or transistor 115 divided by the resistance value of the resistor 114 or resistor 112. The switching current approaches zero as the value of the resistors 114 and 112 becomes very high. It will be understood that various modifications may become apparent to those skilled in the art without departing from the spirit and scope of the invention which is defined by the appended claims.

What is claimed is:

1. A self-oscillating drive circuit for a piezoelectric transducer, comprising:
   a capacitor in parallel with the transducer to prevent harmonic oscillations;
   a first silicon controlled rectifier coupled to a first terminal of the transducer and to a power supply voltage;
   a second silicon controlled rectifier coupled to a second transducer terminal and to the supply voltage;
   a third silicon controlled rectifier coupled to the first transducer terminal and to a ground control line;
   a fourth silicon controlled rectifier coupled to the second transducer terminal and to the ground control line;
   a pair of switching transistors, each connected between an output element of a respective one of said third and fourth silicon controlled rectifiers and the ground control line, between a control element of said first and third and said second and fourth silicon controlled rectifiers and the ground control line, and each being connected to an output of a respective other of said third and fourth silicon controlled rectifiers to switch when the current in the transducer is approximately zero, to alternatingly switch said first and fourth rectifiers on while switching said second and third rectifiers off, and to switch said second and third rectifiers on while switching said first and fourth rectifiers off;
   a transistor switch coupled between the ground control line and ground, said transistor switch being closed upon application of a turn on signal to allow said circuit to oscillate and being open in the absence of a turn on signal to prevent said circuit from oscillating; and
   a current source and an $I^2L$ gate connected to said current source and to receive said turn on signal to open said $I^2L$ gate to apply a current from said current source to said transducer to start said circuit in oscillation.

* * * * *

UNITED STATES PATENT AND TRADEMARK OFFICE
CERTIFICATE OF CORRECTION

PATENT NO. : 4,496,914

DATED : January 29, 1985

INVENTOR(S) : Bernhard H. Andresen, Stephen R. Schenck, Nathan R. Kennedy

It is certified that error appears in the above—identified patent and that said Letters Patent is hereby corrected as shown below:

The title should read:

--PIEZO HORN SELF-OSCILLATING DRIVE CIRCUIT--

Signed and Sealed this

Third Day of September 1985

[SEAL]

Attest:

DONALD J. QUIGG

Attesting Officer     Acting Commissioner of Patents and Trademarks - Designate